(12) United States Patent
Verma et al.

(10) Patent No.: US 9,213,137 B2
(45) Date of Patent: Dec. 15, 2015

(54) SEMICONDUCTOR DEVICES INCLUDING PHOTODETECTORS INTEGRATED ON WAVEGUIDES AND METHODS FOR FABRICATING THE SAME

(71) Applicant: GLOBALFOUNDRIES Singapore Pte. Ltd., Singapore (SG)

(72) Inventors: Purakh Raj Verma, Singapore (SG); Kah-Wee Ang, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 233 days.

(21) Appl. No.: 13/941,191

(22) Filed: Jul. 12, 2013

(65) Prior Publication Data

US 2015/0016769 A1    Jan. 15, 2015

(51) Int. Cl.
| | |
|---|---|
| G02B 6/12 | (2006.01) |
| H01L 21/00 | (2006.01) |
| G02B 6/136 | (2006.01) |
| H01L 31/18 | (2006.01) |
| G02B 6/132 | (2006.01) |
| G02B 6/134 | (2006.01) |

(52) U.S. Cl.
CPC ............ *G02B 6/12004* (2013.01); *G02B 6/136* (2013.01); *H01L 31/1808* (2013.01); *G02B 6/132* (2013.01); *G02B 6/134* (2013.01)

(58) Field of Classification Search
CPC . G02B 6/12004; G02B 6/136; H01L 31/1808
USPC ................................................. 385/14; 438/69
See application file for complete search history.

(56) References Cited

U.S. PATENT DOCUMENTS

| | | | |
|---|---|---|---|
| 7,262,117 B1 | 8/2007 | Gunn, III et al. | |
| 2011/0147870 A1 | 6/2011 | Ang et al. | |
| 2012/0129302 A1* | 5/2012 | Assefa et al. | ................ 438/154 |
| 2013/0071058 A1 | 3/2013 | Lim et al. | |

OTHER PUBLICATIONS

Feng, Ning-Ning, et al., "Vertical p-i-n germanium photodetector with high external responsivity integrated with large core Si waveguides.," Jan. 4, 2010 / vol. 18, No. 1 / Optics Express, pp. 96-101.
Intellectual Property Office, Examination Report in Taiwanese Patent Application No. 103105791 mailed Aug. 24, 2015 (126.0006TW). X.

* cited by examiner

*Primary Examiner* — Jerry Blevins
(74) *Attorney, Agent, or Firm* — Ingrassia Fisher & Lorenz, P.C.

(57) ABSTRACT

Semiconductor devices and methods for fabricating semiconductor devices are provided. In one example, a method for fabricating a semiconductor device includes etching a waveguide layer in a detector region of a semiconductor substrate to form a recessed waveguide layer section. A ridge structure germanium (Ge) photodetector is formed overlying a portion of the recessed waveguide layer section.

13 Claims, 5 Drawing Sheets

SEMICONDUCTOR DEVICES INCLUDING PHOTODETECTORS INTEGRATED ON WAVEGUIDES AND METHODS FOR FABRICATING THE SAME

TECHNICAL FIELD

The technical field relates generally to semiconductor devices and methods for fabricating semiconductor devices, and more particularly relates to semiconductor devices including photodetectors integrated on waveguides and methods for fabricating such semiconductor devices.

BACKGROUND

Silicon photonics uses silicon as an optical medium and has been an active development area in recent years because of its potential monolithic integration with complementary-metal-oxide-semiconductor (CMOS) microelectronic circuits. Silicon is transparent to infrared light with wavelengths above about 1.1 µm and also has a very high refractive index of, for example, about 3.5. The tight optical confinement provided by this high refractive index allows for optical waveguides.

For silicon photonic components, e.g., waveguides and the like, to remain optically independent from the bulk silicon of the semiconductor wafer on which they are fabricated, it is necessary to have a layer of intervening material. Typically silica is used as an intervening material because of its much lower refractive index, about 1.44 in the wavelength region of interest, than silicon and thus, light at the silicon-silica interface will undergo total internal reflection and remain in the silicon. This construction is known as silicon-on-insulator (SOI) and the waveguides formed from this construction are commonly referred to as SOI waveguides. As such, silicon photonic devices can be made using existing semiconductor fabrication techniques, and because silicon is used as the substrate for most integrated circuits, it is possible to create hybrid devices in which the optical and electronic components are integrated onto a single microchip.

Because of their compatibility with CMOS technology, p-i-n germanium (Ge)-based photodetectors have also drawn much attention. P-i-n Ge photodetectors exhibit good responsivity and quantum efficiency for optical absorption. Integrating p-i-n Ge photodetectors onto SOI waveguides offers the advantage of low junction capacitance, efficient power transferring from the waveguide to the Ge photodetector, and ease of process integration. Unfortunately, current p-i-n Ge photodetectors integrated on SOI waveguides typically result in large topographical variation and optical mode proximity to the p-i-n electrodes and associated contacts, resulting in process complexity, high loss, and reduced optical sensitivity.

Accordingly, it is desirable to provide semiconductor devices including photodetectors integrated on waveguides with reduced topographical variation and methods for fabricating such semiconductor devices. Moreover, it is desirable to provide semiconductor devices including photodetectors integrated on waveguides with reduced loss and improved optical sensitivity. Furthermore, other desirable features and characteristics of the present invention will become apparent from the subsequent detailed description and the appended claims, taken in conjunction with the accompanying drawings and this background.

BRIEF SUMMARY

Semiconductor devices and methods for fabricating semiconductor devices are provided herein. In accordance with an exemplary embodiment, a method for fabricating a semiconductor device includes etching a waveguide layer in a detector region of a semiconductor substrate to form a recessed waveguide layer section. A ridge structure germanium (Ge) photodetector is formed overlying a portion of the recessed waveguide layer section.

In accordance with another exemplary embodiment, a method for fabricating a semiconductor device is provided. The method includes forming a first field oxide layer section and a second field oxide layer section overlying a waveguide layer in a detector region of a semiconductor substrate. The first and second field oxide layer sections are spaced apart to expose an intermediate section of the waveguide layer. A trench is isotropically etched into the intermediate section of the waveguide layer to form a recessed waveguide layer section. The trench forms a first undercut under the first field oxide layer section and a second undercut under the second field oxide layer section. The trench including the first and second undercuts is filled with germanium (Ge) to form a Ge fill. The Ge fill is selectively etched to form a first recessed Ge layer section, a second recessed Ge layer section, and a Ge ridge structure that is disposed between the first and second recessed Ge layer sections. The first recessed Ge layer section and a first sidewall portion of the Ge ridge structure that are adjacent to each other are P+ doped to form a P+ electrode. The second recessed Ge layer section and a second sidewall portion of the Ge ridge structure that are adjacent to each other are N+ doped to form an N+ electrode.

In accordance with another exemplary embodiment, a semiconductor device is provided. The semiconductor device includes a waveguide that overlies a buried oxide layer of a semiconductor substrate. The waveguide includes a waveguide layer that has a recessed waveguide layer section disposed in a detector region of the semiconductor substrate. A ridge structure germanium (Ge) photodetector overlies a portion of the recessed waveguide layer section.

BRIEF DESCRIPTION OF THE DRAWINGS

The various embodiments will hereinafter be described in conjunction with the following drawing figures, wherein like numerals denote like elements, and wherein:

FIG. 1 illustrates, in top view, the semiconductor device at an early fabrication stage. FIGS. 2-9 illustrate, in cross-sectional views, the semiconductor device at further advanced fabrication stages.

DETAILED DESCRIPTION

Figure 1:
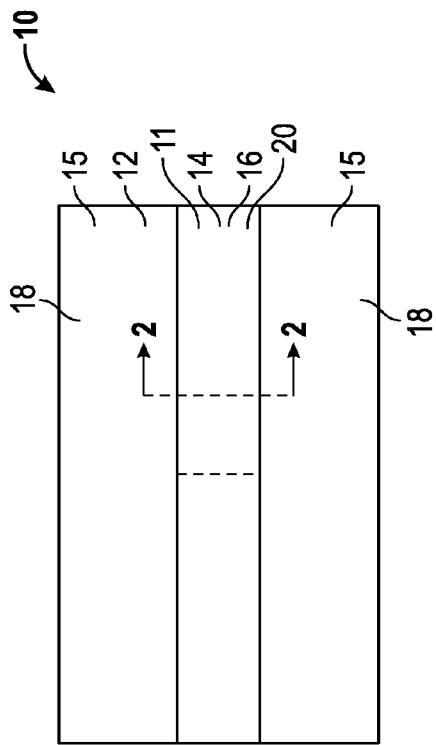
FIGS. 1-9 illustrate a semiconductor device and methods for fabricating a semiconductor device in accordance with an exemplary embodiment.

The following Detailed Description is merely exemplary in nature and is not intended to limit the various embodiments or the application and uses thereof. Furthermore, there is no intention to be bound by any theory presented in the preceding background or the following detailed description.

Various embodiments contemplated herein relate to semiconductor devices including photodetectors integrated on waveguides and methods for fabricating such semiconductor devices. The exemplary embodiments taught herein provide a semiconductor device that includes a waveguide that overlies a buried oxide layer of a semiconductor substrate. The waveguide includes a waveguide layer that is formed of silicon and that has a recessed waveguide layer section disposed in a detector region of the semiconductor substrate. In an exemplary embodiment, the recessed waveguide layer section is formed by etching a trench into a portion of the waveguide layer that is disposed in the detector region of the semiconductor substrate.

A ridge structure germanium (Ge) photodetector is arranged in the trench and overlies and is operatively coupled to a portion of the recessed waveguide layer section. In an exemplary embodiment, the ridge structure Ge photodetector is formed by filling the trench with Ge to form a Ge fill that overlies the recessed waveguide layer section. The Ge fill is selectively etched to form a first recessed Ge layer section, a second recessed Ge layer section, and a ridge Ge structure that is disposed between the first and second recessed Ge layer sections. At least a substantial portion of the ridge Ge structure is disposed in the trench overlying the recessed waveguide layer section. As such, the topographical difference between the uppermost surface of the ridge Ge structure and the waveguide layer that surrounds the recessed waveguide layer section is offset or reduce by about the depth of the trench compared to if the ridge Ge structure had been formed directly on the waveguide layer, thereby reducing subsequent process complexity.

In an exemplary embodiment, the first recessed Ge layer section and a first sidewall portion of the Ge ridge structure that are adjacent to each other are P+ doped to form a P+ electrode. The second recessed Ge layer section and a second sidewall portion of the Ge ridge structure that are adjacent to each other are N+ doped to form an N+ electrode. The P+ and N+ electrodes are separated from each other by a Ge core ridge portion of the Ge ridge structure. In an exemplary embodiment, first and second sidewall spacers are formed correspondingly adjacent to the first and second sidewall portions of the Ge ridge structure. First and second medal silicide regions are then formed in the first recessed Ge layer section of the P+ electrode using the first and second sidewall spacers as masks, thereby offsetting the metal silicide regions from the sidewall portions of the Ge ridge structure. An ILD layer of a dielectric material is formed overlying the ridge structure Ge photodetector. First and second contacts of conductive material are formed extending through the ILD layer to the first and second metal silicide regions, respectively. By forming the P+ and N+ electrodes spaced apart by the Ge core ridge portion of the Ge ridge structure, and further by using the sidewall spacers to offset the metal silicide regions and the corresponding contacts from the sidewall portions of the Ge ridge structure, the proximity of the P+ and N+ electrodes and the associated contacts to the ridge structure germanium (Ge) photodetector is more remote to decrease optical loss and improve optical sensitivity.

FIG. 1 illustrates, in top view, a semiconductor device 10 at an early fabrication stage in accordance with an exemplary embodiment. The described process steps, procedures, and materials are to be considered only as exemplary embodiments designed to illustrate to one of ordinary skill in the art the methods contemplated herein; the methods are not limited to these exemplary embodiments. Various steps in the manufacture of semiconductor devices are well known and so, in the interest of brevity, many conventional steps will only be mentioned briefly herein or will be omitted entirely without providing the well-known process details.

The semiconductor device 10 includes a semiconductor substrate 12. The semiconductor substrate 12 includes a silicon layer 11 that overlies a buried oxide layer 13 (see FIG. 2) that overlies a bulk substrate layer (not shown) to form an SOI substrate as is known in the art. As illustrated, the silicon layer 11 is etched, for example, to form a waveguide layer 14 between spaced apart trenches 15 to define a waveguide 16. In an exemplary embodiment, the trenches 15 are filled with an intervening material 18, e.g., silicon oxide or silicon nitride, so that together with the buried oxide layer 13 (FIG. 2) light will remain in the waveguide layer 14 via total internal reflection. As illustrated, a region of the waveguide layer 14 is designated for forming a photodetector and defines a detector region 20 (bounded by dashed line).

Figure 2:
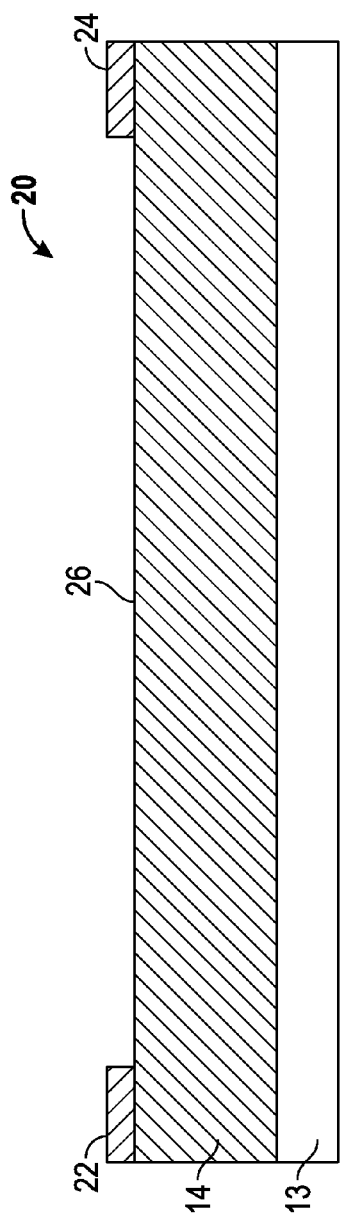

FIGS. 2-9 illustrate, in cross-sectional views along line 2-2 in the detector region 20 depicted in FIG. 1, the semiconductor device 10 at further advanced fabrication stages. Referring to FIG. 2, an oxide material, e.g., silicon oxide, is deposited overlying the waveguide layer 14 and is etched to form field oxide layer sections 22 and 24. The field oxide layer sections 22 and 24 are spaced apart from each other to expose an intermediate section 26 of the waveguide layer 14. In an exemplary embodiment, the oxide material is deposited and etched using well known deposition, patterning, and etching techniques such as chemical vapor deposition (CVD), lithography, dry etching, e.g., reactive ion etching (RIE), and the like.

Figure 3:
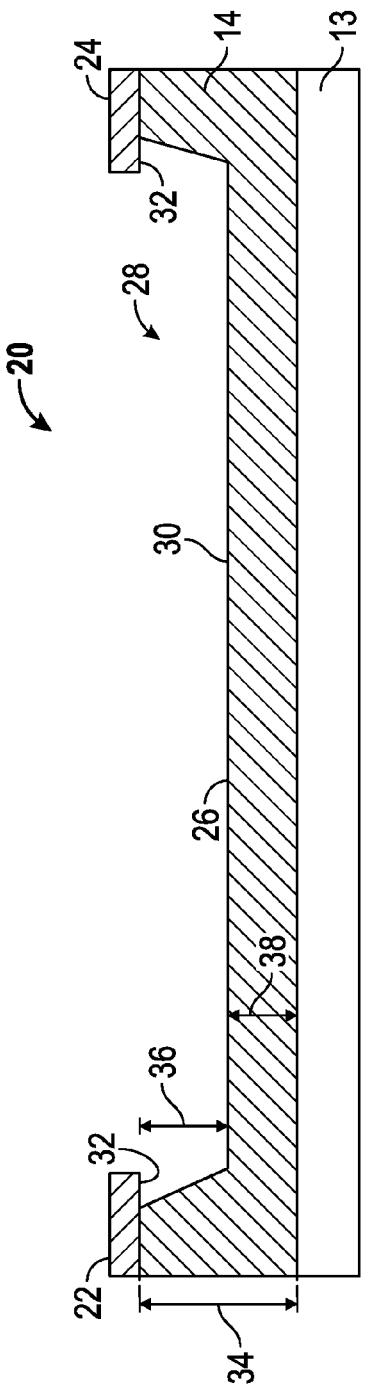

The process continues as illustrated in FIG. 3 by etching a trench 28 into the intermediate section 26 of the waveguide layer 14 to form a recessed waveguide layer section 30. In an exemplary embodiment, the trench 28 is formed by isotropically etching the intermediate section 26 using a wet etching process, such as wet chemical etching with an etchant such as KOH, TMAH, or the like. TMAH (tetra-methyl-ammonium-hydroxide) solution is commonly stocked in a 25% concentration. To get a desired etchant concentration, in an exemplary embodiment, mix a desired amount of 25% TMAH solution with deionized water. In one example, a typical recipe includes 250 mL 25% TMAH and 375 mL deionized water, and is heated to 80° C. As illustrated, isotropically etching the waveguide layer 14 forms undercuts 32 under the field oxide layer sections 22 and 24. In an exemplary embodiment, the waveguide layer 14 has a thickness (indicated by double headed arrow 34) of from about 2 to about 3 µm and material (silicon) is removed from the waveguide layer 14 for a depth (indicated by double headed arrow 36) of from about 1.25 to about 2.75 µm to form the recessed waveguide layer section 30 that has a thickness (indicated by double headed arrow 38) of from about 0.25 to about 0.75 µm, such as about 0.5 µm.

Figure 4:
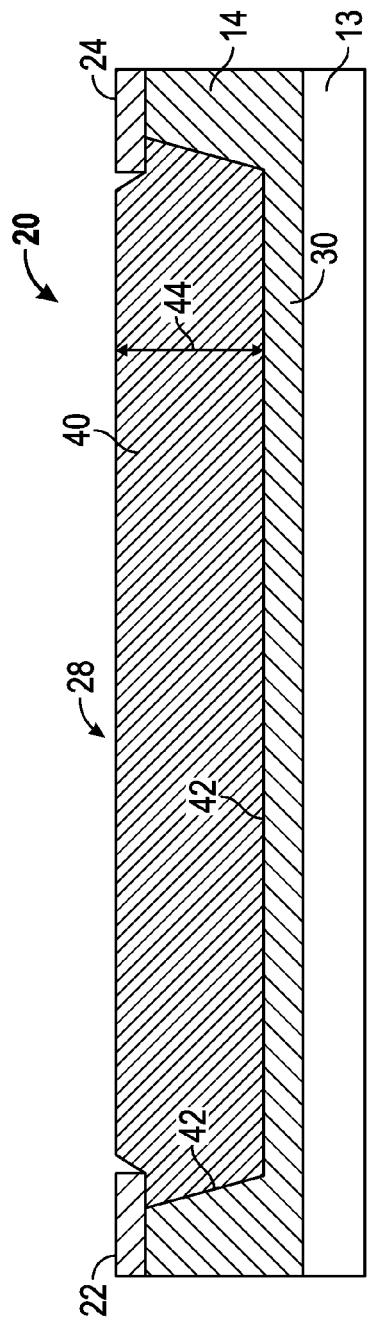

Referring to FIG. 4, the trench 28 including the undercuts 32 is filled with germanium (Ge) to form a Ge fill 40. In an exemplary embodiment, the silicon material on the surface 42 of the recessed waveguide layer section 30 and corresponding sidewalls of the waveguide layer 14 have a (111) crystalline surface and Ge is selectively deposited into the trench 28 using an epitaxial growth process. In an exemplary embodiment, Ge is epitaxially grown on the surface 42 at a temperature of from about 560 to about 640° C. to a thickness (indicated by double headed arrow 44) of from about 2.5 to about 3.5 µm.

Figure 5:
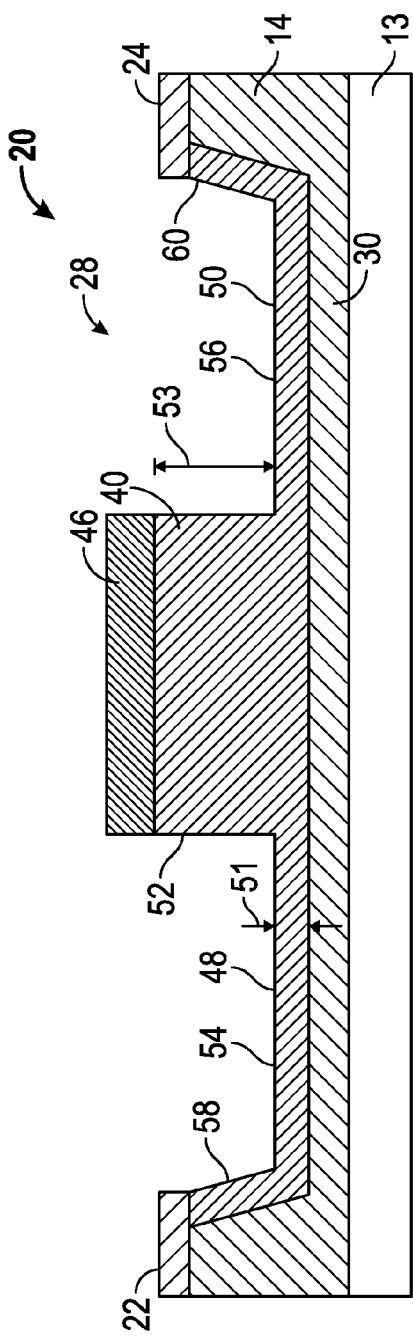

The process continues as illustrated in FIG. 5 by depositing and patterning a hard mask material, e.g., silicon oxide, silicon nitride, or the like, overlying the Ge fill 40 to form a patterned hard mask layer section 46. The patterned hard mask layer section 46 is used to selectively etch the Ge fill 40 to form recessed Ge layer sections 48 and 50 and a Ge ridge structure 52 that is disposed between the recessed Ge layer sections 48 and 50. The patterned hard mask layer section 46, the recessed Ge layer sections 48 and 50, and the Ge ridge structure 52 are formed using well known deposition, patterning, and etching techniques, e.g., CVD, lithography, dry etching such as RIE, and the like. In an exemplary embodiment, the recessed Ge layer sections 48 and 50 have a thickness (indicated by arrows 51 of from about 0.25 to about 0.75 µm and the Ge ridge structure 52 has a height (indicated by double headed arrow 53) of from about 2 to about 3 µm.

As illustrated, the recessed Ge layer sections 48 and 50 have corresponding lower sections 54 and 56 and sidewall portions 58 and 60 that interface with the field oxide layer sections 22 and 24. As such, the waveguide layer 14 in the detector region 20 including the recessed waveguide layer section 30 is completely enclosed by the recessed Ge layer sections 48 and 50, the Ge ridge structure 52, the field oxide layer sections 22 and 24, the buried oxide layer 13, and the intervening material 18 (see FIG. 1) to minimize light loss through the waveguide layer 14.

Figure 6:
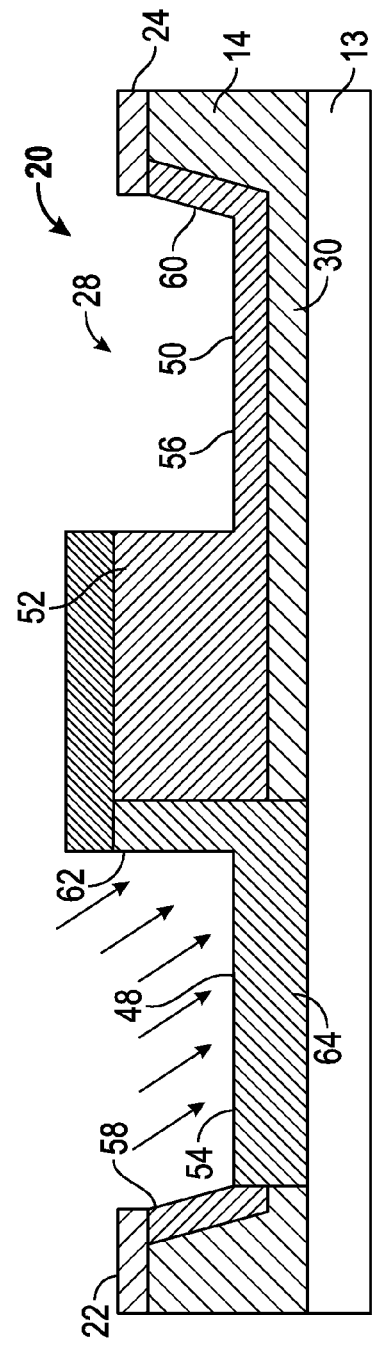
Figure 7:
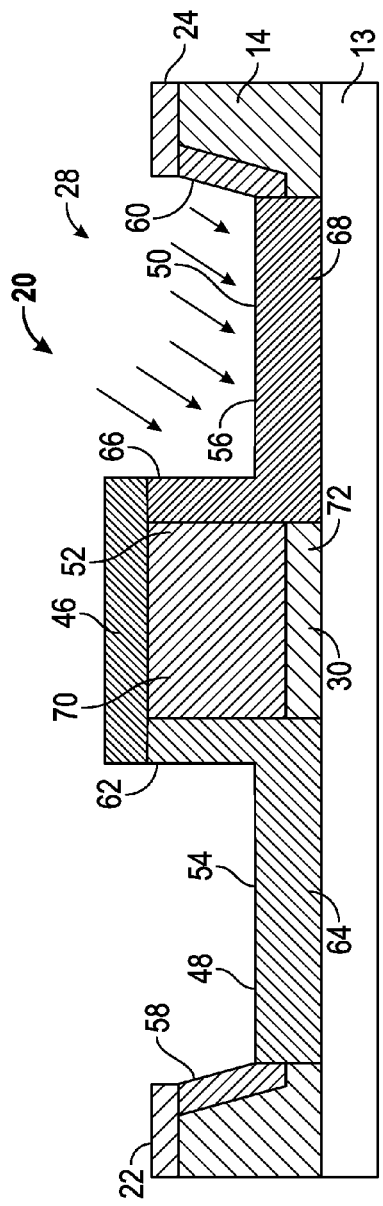

Referring to FIGS. 6-7, the recessed Ge layer section 48 and a sidewall portion 62 of the Ge ridge structure 52 are P+ doped to form a P+ electrode 64 and the recessed Ge layer section 50 and a sidewall portion 66 of the Ge ridge structure 52 are N+ doped to form an N+ electrode 68. In an exemplary embodiment, the sidewall portion 62, the lower section 54 of the recessed Ge layer section 48, and a portion of the recessed waveguide layer section 30 that underlies the lower section 54 are P+ doped by angle implanting P+ dopants, such as B, BF2, and the like, to form the P+ electrode 64. Likewise, the sidewall portion 66, the lower section 56 of the recessed Ge layer section 50, and a portion of the recessed waveguide layer section 30 that underlies the lower section 56 are N+ doped by angle implanting N+ dopants, such as Ar and the like, to form the N+ electrode 68. In an exemplary embodiment, the P+ dopants are angle implanted at a dose of from about $1\times10^{14}$ to about $1\times10^{16}$ ions·cm$^{-2}$ and an accelerating voltage of from about 1 to about 100 KeV, and the N+ dopants are angle implanted at a dose of from about $1\times10^{14}$ to about $1\times10^{16}$ ions·cm$^{-2}$ and an accelerating voltage of from about 1 to about 100 KeV, such as from about 1 to about 10 KeV. As illustrated, the P+ and N+ electrodes 64 and 68 are separated from each other by a Ge core ridge portion 70 that is disposed between the sidewall portions 62 and 66 of the Ge ridge structure 52 and that overlies a portion 72 the recessed waveguide layer section 30.

Figure 8:
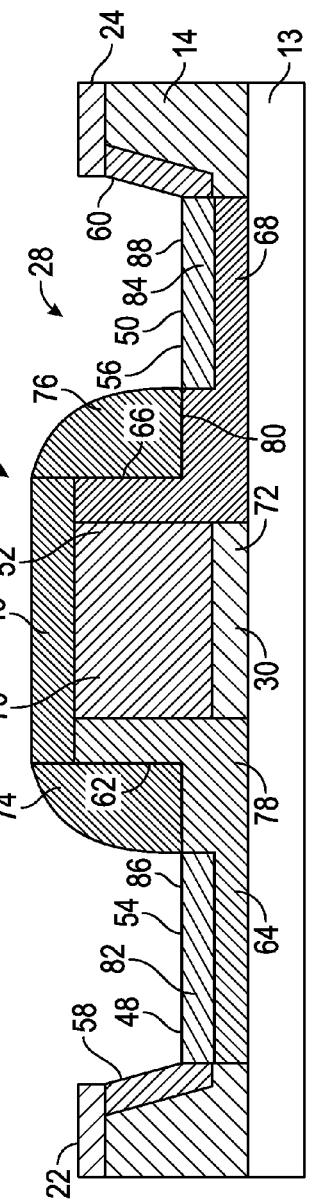

The process continues as illustrated in FIG. 8 by forming sidewall spacers 74 and 76 correspondingly adjacent to the sidewall portions 62 and 66 of the Ge ridge structure 52. The sidewall spacers 74 and 76 may be formed on the basis of oxidation and/or deposition techniques. The sidewall spacers 74 and 76 are separated from each other by the patterned hard mask layer section 46 and correspondingly overlie portions 78 and 80 of the P+ and N+ electrodes 64 and 68, respectively. In an exemplary embodiment, metal silicide regions 82 and 84 are formed in exposed portions 86 and 88 of the recessed Ge layer sections 48 and 50 of the P+ and N+ electrodes 64 and 68 using the sidewall spacers 74 and 76 as masks, respectively. The metal silicide regions 82 and 84 may be formed by depositing a refractory metal, such as, for example, cobalt, nickel, titanium, tantalum, platinum, palladium, and/or rhodium, into the exposed portions 86 and 88 and subsequently performing one or more heat treatments to initiate a chemical reaction to form metal silicide. As illustrated, the Ge ridge structure 52, the P+ and N+ electrodes 64 and 68 including the metal silicide regions 82 and 84, the sidewall spacers 74 and 76 and the patterned hard mask layer section 46 form a ridge structure Ge photodetector 90 that is arranged in the trench 28 overlying the portion 72 of the recessed waveguide layer section 30.

Figure 9:
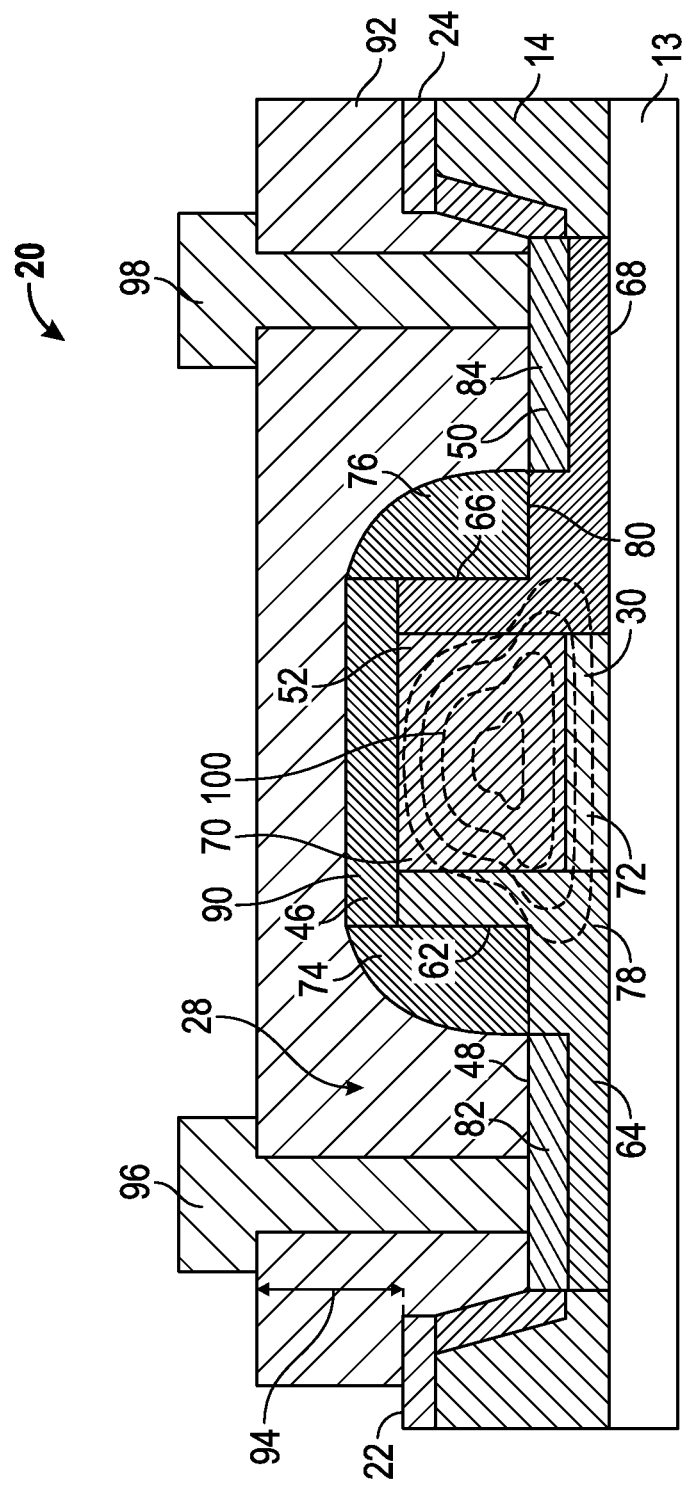

The process continues as illustrated in FIG. 9 by forming an interlayer dielectric (ILD) layer 92 of a dielectric material, e.g., silicon oxide, overlying the ridge structure Ge photodetector 90. The dielectric material can be deposited, for example, by CVD and the decomposition of a source material, such as tetraethylorthosilicate (TEOS) as is well known in the art. The ILD layer 92 may be subsequently planarized using a chemical mechanical planarization (CMP) process. In an exemplary embodiment, the ILD layer 92 has a thickness (indicated by double headed arrow 94) of from about 0.75 to about 1.5 µm from an uppermost surface of the waveguide layer 14 to an uppermost surface of the ILD layer 92.

In an exemplary embodiment, contacts 96 and 98 of conductive material are formed extending through the ILD layer 92 to the metal silicide regions 82 and 84. The contacts 96 and 98 may be formed, for example, by dry etching contact trenches through the ILD layer 92 and depositing by CVD the conductive material to fill the contact trenches. The dashed line patterns 100 are representative of light being guided through the portion 72 of the recessed waveguide layer section 30 to the ridge structure Ge photodetector 90.

Accordingly, semiconductor devices including photodetectors integrated on waveguides and methods for fabricating such semiconductor devices have been described. In an exemplary embodiment, a semiconductor device is fabricated by etching a waveguide layer in a detector region of a semiconductor substrate to form a recessed waveguide layer section. A ridge structure germanium (Ge) photodetector is formed overlying a portion of the recessed waveguide layer section.

While at least one exemplary embodiment has been presented in the foregoing detailed description of the disclosure, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing an exemplary embodiment of the disclosure. It being understood that various changes may be made in the function and arrangement of elements described in an exemplary embodiment without departing from the scope of the disclosure as set forth in the appended claims.

What is claimed is:

1. A method for fabricating a semiconductor device, the method comprising:
   etching a waveguide layer in a detector region of a semiconductor substrate to form a recessed waveguide layer section; and
   forming a ridge structure germanium (Ge) photodetector overlying a portion of the recessed waveguide layer section, wherein forming the ridge structure Ge photodetector comprises:
   forming a Ge fill overlying the recessed waveguide layer section;
   selectively etching the Ge fill to form a first recessed Ge layer section, a second recessed Ge layer section, and a Ge ridge structure disposed between the first and second recessed Ge layer sections;
   P+ doping the first recessed Ge layer section and a first sidewall portion of the Ge ridge structure that are adjacent to each other to form a P+ electrode; and
   N+ doping the second recessed Ge layer section and a second sidewall portion of the Ge ridge structure that are adjacent to each other to form an N+ electrode.

2. The method of claim 1, wherein etching the waveguide layer comprises removing material from the waveguide layer for a depth of from about 1.25 to about 2.75 µm to form the recessed waveguide layer section.

3. The method of claim 1, wherein etching the waveguide layer comprises forming the recessed waveguide layer section having a thickness of from about 0.25 to about 0.75 µm.

4. The method of claim 1, wherein P+ doping and N+ doping comprise forming the P+ and N+ electrodes such that the P+ and N+ electrodes are separated from each other by a Ge core ridge portion of the Ge ridge structure, wherein the Ge core ridge portion is disposed between the first and second sidewall portions and overlies the portion of the recessed waveguide layer section.

5. The method of claim 4, wherein the portion of the recessed waveguide layer section that underlies the Ge core ridge portion is an intermediate portion of the recessed waveguide layer section, wherein P+ doping further comprises P+ doping a first adjacent portion of the recessed waveguide layer section that underlies the first recessed Ge layer section to form the P+ electrode, wherein N+ doping further comprises N+ doping a second adjacent portion of the recessed waveguide layer section that underlies the second recessed Ge layer section to form the N+ electrode, and wherein the intermediate portion of the recessed waveguide layer section is disposed between the first and second adjacent portions.

6. The method of claim 1, wherein forming the Ge fill comprises forming the Ge fill having a thickness of from about 2.5 to about 3.5 µm.

7. The method of claim 1, wherein selectively etching the Ge fill comprises forming the first recessed Ge layer section and the second recessed Ge layer section each having a thickness of from about 0.25 to about 0.75 µm.

8. The method of claim 1, wherein selectively etching the Ge fill comprises forming the Ge ridge structure having a height of from about 2 to about 3 µm from uppermost surfaces of the first and second recessed Ge layer sections to an uppermost surface of the Ge ridge structure.

9. The method of claim 1, wherein forming the ridge structure Ge photodetector comprises:

depositing a hard mask material overlying the Ge fill; and
patterning the hard mask material to form a patterned hard mask layer section, wherein selectively etching comprises selectively etching the Ge fill using the patterned hard mask layer section to form the first recessed Ge layer section, the second recessed Ge layer section, and the Ge ridge structure, and wherein the patterned hard mask layer section overlies the Ge ridge structure.

10. The method of claim 9, wherein forming the ridge structure Ge photodetector comprises forming a first sidewall spacer and a second sidewall spacer correspondingly adjacent to the first and second sidewall portions of the Ge ridge structure, and wherein the patterned hard mask layer section is disposed between the first and second sidewall spacers.

11. The method of claim 10, wherein forming the ridge structure Ge photodetector comprises:

forming a first metal silicide region in the first recessed Ge layer section of the P+ electrode using the first sidewall spacer as a first mask; and
forming a second metal silicide region in the second recessed Ge layer section of the N+ electrode using the second sidewall spacer as a second mask.

12. The method of claim 11, further comprising:

forming an ILD layer of a dielectric material overlying the ridge structure Ge photodetector;
forming a first contact and a second contact of conductive material extending through the ILD layer to the first and second metal silicide regions, respectively.

13. The method of claim 12, wherein forming the ILD layer comprises forming the ILD layer having a thickness of from about 0.75 to about 1.5 µm from an upper most surface of the waveguide layer.

* * * * *